United States Patent [19]
Zdeblick et al.

[11] Patent Number: 4,906,840
[45] Date of Patent: Mar. 6, 1990

[54] INTEGRATED SCANNING TUNNELING MICROSCOPE

[75] Inventors: Mark Zdeblick, Los Altos Hills; Thomas R. Albrecht, Stanford, both of Calif.

[73] Assignee: The Board of Trustees of Leland Stanford Jr., University, Palo Alto, Calif.

[21] Appl. No.: 149,236

[22] Filed: Jan. 27, 1988

[51] Int. Cl.$^4$ .................................. G01N 23/00
[52] U.S. Cl. ................................ 250/306; 250/307; 250/442.1; 310/332; 310/328
[58] Field of Search ............... 250/306, 307, 440.1, 250/442.1; 310/328, 310, 332

[56] References Cited

U.S. PATENT DOCUMENTS 4,575,822 3/1986 Quate ................................ 365/174
4,668,865 5/1987 Gimzewski et al. ............... 250/306

FOREIGN PATENT DOCUMENTS 0194323 7/1985 European Pat. Off. .

OTHER PUBLICATIONS

Pohl et al, "Tracking Tunneling Microscopy", Rev. Sci. Instrum., 59(6), Jun. 1988.
Larson et al., *IEEE Transactions on Sonics & Ultrasonics*, Jan. 1972, 18-22, "RF Diode Sputtered ZnO Transducers".
Rozgonyi et al., *Applied Physics Letters*, vol. 8, 9: 220-223, (1986), "Preparation of ZnO Thin Films . . . ".
Denburg, *IEEE Transactions on Sonics & Ultrasonics*, vol. su-18, No. 1, Jan. 1971, "Wide-Bandwidth High-Coupling . . . ".
Chen et al., *1980 Ultrasonics Symposium:* 945 (1980), "Thin Film ZnO-MOS Transducer with Virtually DC Response".
Khuri-Yakub et al., *Jrnl. of Applied Physics:* 46 (8): 3266-3272 (1975), "Studies of Optimum Conditions for Growth . . . ".
Shiosaki & Kawabata, *Appl. Phys. Jrnl.*, 35 (1): 10,11 (1974), "Low-frequency piezoelectric-transducer applications . . . ".
IBM-*Journal of Research and Development*, vol. 30, No. 4, Jul. 1986.
Dialog Search of the INSPEC file (Feb. 17, 1988).
Kim & Muller, *IEEE Electron Device Letters*, EDL-8 (10): "IC-Processed Piezoelectric Microphone", (1987).
Royer et al., *Sensors and Actuators*, 4 (1983), 357-362, "ZnO ON Si Integrated Acoustic Sensor".

Primary Examiner—Carolyn E. Fields
Assistant Examiner—John A. Miller
Attorney, Agent, or Firm—Ronald Craig Fish

[57] ABSTRACT

There is disclosed herein an integrated scanning tunneling microscope and an integrated piezoelectric transducer and methods for making both. The device consists of one or two arm piezoelectric bimorph cantilevers formed by micromachining using standard integrated circuit processing steps. These cantilevers are attached to the substrate at one area and are free to move under the influence of piezoelectric forces which are caused by the application of appropriate voltages generated by control circuitry and applied to pairs of electrodes formed as an integral part of the bimorph cantilever structure. The electric fields caused by the control voltages cause the piezoelectric bimorphs to move in any desired fashion within ranges determined by the design. The bimorph cantilevers have tips with very sharp points formed thereon which are moved by the action of the control circuit and the piezoelectric bimorphs so to stay within a very small distance of a conducting surface. The movements of the tip can be tracked to yield an image of the surface at atomic resolution.

23 Claims, 13 Drawing Sheets

X-SCAN (a) (b)

Z-SCAN (a) (b)

Y-SCAN (a) (b)

ROTATION (a) (b)

INTEGRATED SCANNING TUNNELING MICROSCOPE

The U.S. Government has a paid-up license in this invention and the right in limited circumstances to require the patent owner to license others on reasonable terms as provided for by the terms of contract No. N000014-84-K-0624 awarded by the Department of the Navy.

BACKGROUND OF THE INVENTION

The invention pertains to the field of scanning tunneling microscopes, and more particularly, to the field of integrated versions of same.

Scanning tunneling microscopes were first invented by a team of researchers from IBM (Binnig and Rohrer). The basic concept of a scanning tunneling microscope is to place a very sharp, conducting tip having tip dimensions on the order of the size of 1 atom in diameter close to a conductive surface. If the tip is brought very close to a conductive surface, i.e., within the space of the diameters of several atoms, (approximately within 5 angstroms), a tunneling current flows between the tip and the surface. That is, the probability density function of electrons for atoms in the tip overlaps in space the probability density function of electrons for atoms on the surface. As a result, tunneling occurs in the form of electron current flow between the tip and the surface if a suitable bias voltage between these two conductors is applied.

The magnitude of the tunneling current is exponentially dependent upon the distance between the tip and the surface. If the distance between the tip and the surface increases by only 1 angstrom, the current is reduced by a factor of 10. Typically, 100 millivolts of bias voltage will provide 1 nanoampere of current for a tip to sample spacing of a few angstroms.

This tunneling current phenomenon can be used to take an image of the surface. To do this, the tip must be placed very close to the surface and must be moved in raster scan-like fashion across the surface while maintaining the relative distance between the tip and the surface. The tip must be moved up and down to follow the contour of the surface to maintain a relatively constant distance between the highest point on the surface and the tip. This distance must be accurately maintained to be within the tunneling overlap distance to maintain constant current flow. As the tip is scanned across the contour of the surface, an image of the surface contour may be built up by keeping track of the movements of the tip. Typically this process of tracking the tip movement is done by keeping track of the voltage applied across a piezoelectric transducer which moves the tip to maintain the constant distance between the tip and the surface. Typically the apparatus that controls the tip distance monitors the current flowing between the tip and the surface and controls a mechanical system to move the tip in such a manner as to stabilize the current flowing between the tip and the surface at some steady state value. Thus, changes in the current will result in changes in the distance between the tip and the surface so as to counteract the changes in the current and stabilize it at a steady state value. Thus, changes in the drive signals to the tip movement mechanism track changes in the surface contour as the height of the tip above the surface is adjusted to maintain constant current.

A collection of papers defining the state of the art in scanning tunneling microscopy is published in the *IBM Journal of Research and Development*, Vol. 30, No. 4, pages 353-440, July 1986. In an article entitled "Scanning Tunneling Microscopy" by Binnig and Rohrer at pages 355-369 of that journal, a scanning tunneling microscope is depicted in FIG. 2 using a piezoelectric tripod. This tripod consists of 3 piezoelectric rods of material joined at a junction; each rod expands and contracts along one of 3 Cartesian coordinate axes. The tip is mounted at the junction of the 3 rods. The tip is brought into proximity of the surface by a rough positioner. Thereafter the piezoelectric tripods are used to scan the tip across the surface to develop an image of that surface. The collection of papers in the *IBM Journal of Research and Development* shows scanning tunneling microscopy as being done with large scale apparatus.

One reference teaches an integrated form of a scanning tunneling microscope. This reference is European Patent Application Publication No. 0194323A1 published Sept. 17, 1986 based on European Application No. 85102554.4 filed July 3, 1985. This patent application describes a scanning tunneling microscope integrated on a semiconductor chip into which slots are etched to form a center portion cantilever. The slots are etched to have mutually orthogonal directions to allow the center portion to perform movements in the X and Y direction under the control of electrostatic forces created between the stripes defined by the slots and their opposite walls. A protruding tip is formed on the center portion which is capable of being moved in the Z direction by means of electrostatic forces. Electrostatic forces are not ideal for tip movement to obtain maximum accuracy. Also, the integrated STM described in the European Patent Application cited above would be difficult to successfully fabricate.

Thus, a need has arisen for an integrated version of the scanning tunneling microscope using piezoelectric means for moving the tip.

SUMMARY OF THE INVENTION

According to the teachings of the invention, there is disclosed both an integrated piezoelectric transducer of novel construction and an integrated scanning tunneling microscope using this piezoelectric transducer for the necessary tip movement. The piezoelectric transducer uses bimorph technology.

In one embodiment of the piezoelectric transducer, a layer of spacer material which will later be removed, is placed over the surface of a silicon or other substrate. Thereafter, a layer of conductive material is formed on the spacer layer and patterned to form three separate electrodes. Then a layer of piezoelectric material is formed over the three electrodes and another layer of conductive material is formed over the layer of piezoelectric material. A second layer of piezoelectric material is then formed over the middle conductor. Finally, a third conductive layer is formed over the second piezoelectric material layer and is patterned to form three separate electrodes which are aligned with the three electrodes of the bottom-most conductive layer. Then a sharp, conductive tip is formed on the center electrode on the uppermost conductive layer. This tip is formed by evaporation deposition of a conductive material through a shadow mask. The evaporation deposition forms a cone of material of ever decreasing diameter on the center, top electrode. The ever-decreasing diameter results as the material landing on the shadow mask slowly closes off the hole in the mask above the point where the tip is being formed.

After the foregoing structure is formed, the sides of the piezoelectric material are etched away to form the bimorph lever. This etching is performed in such a manner that sufficient piezoelectric material is left on the sides to completely encase the center electrode. This etching of the piezoelectric material is done by first depositing a layer of titanium/tungsten metal and patterning this layer to act as an etch mask. This layer of metal is patterned using conventional photolithography techniques to define where the edge of the piezoelectric material is to be. After the metal etch mask is formed, the zinc oxide piezoelectric material is etched using the metal mask as a guide. If other piezoelectric materials are used which may be etched with good resolution, this step of depositing and forming a metal etch mask may be eliminated. Zinc oxide is a piezoelectric material which cannot easily be etched with good resolution. The step of forming the metal etch mask substantially improves the resolution which may be obtained in etching the zinc oxide material. "Resolution" as the term is used here is intended to specify the degree of control over the position of the edge of the zinc oxide.

After the piezoelectric material has been etched, the spacer material underlying the entire structure is removed. This spacer material is removed only up to the point where the cantilever bimorph is to be physically attached to the substrate. Removal of the spacer material causes the bimorph cantilever to extend out from its attachment point over the substrate with an air space between the bottom of the bimorph and the top surface of the substrate. This allows the bimorph to move up and down normal to the surface of the substrate by the effect of the piezoelectric material thereby allowing the tip to be moved. The existence of four pairs of electrodes and two layers of piezo material in this embodiment, allows three axis movement of the tip to be obtained.

To operate the structure just described so as to cause the tip to make raster scanning movements, various voltage combinations are applied to the four pairs of electrodes formed by the middle layer electrode and the outer electrodes on the bottom and top electrode layers. By suitably controlling the voltages applied to these four electrode pairs, the tip may be made to move along any of the three axes in a Cartesian coordinate system.

In alternative embodiments, two such bimorph structures each having two piezo layers but only two pairs of electrodes, formed as previously described, may be fabricated so as to extend out over the substrate from their attachment points and to intersect each other at a 90° angle and to be joined at the intersection. These two bimorphs may then be controlled in a similar manner to the manner described above for a single bimorph to move the intersection point along any of the three axes of a Cartesian coordinate system. In an alternative embodiment, two conductive tips may be formed at the end of the bimorph and the voltages applied to the electrodes may be manipulated so that the tip of the bimorph rotates to provide independent Z axis motion for each tip and synchronous X and Y motion for both tips.

An alternative, and preferred, embodiment of the method for forming the bimorph piezoelectric transducer structure described above, is to form the multilayer structure directly on a silicon substrate without any spacer material as described above but to free the bimorph cantilever from the substrate by etching through to the under surface of the cantilevered bimorph from the back side of the wafer.

A scanning tunnelling microscope according to the teachings of the invention may be made by using any of the processes described herein to manufacture a bimorph tip movement structure and then placing the tip sufficiently close to a conductive surface to be scanned such as by attaching to the substrate on which the bimorph is integrated another wafer containing the conductive surface to be scanned. Suitable known control circuitry may then be integrated on either substrate if it is of semiconductor material to sense the tunneling current and to control the voltages applied to the electrodes of the bimorph.

The scanning tunneling microscope structures in integrated form described herein have many potential applications including imaging at the atomic level, atomic scale lithography and mass storage. Mass storage systems of very high density can be formed using such a structure by defining a discrete number of "cells" within the raster scannable surface of a conductive plane formed adjacent to the tip. Each cell constitutes one memory location. Each memory location is written as a 1 or 0 by depositing a molecule of sufficient size to be detected by the scanning tunneling microscope within each cell to form a 1 and not depositing such a molecule in the cell to form a 0. As the scanning tunneling microscope raster scans over such a surface, those cells wherein molecules are deposited are read as ones as the tip is forced by its control system to move away from the surface to maintain a steady tunneling current as the tip passes over the molecule. Essentially, the molecule forms a "hill" in an otherwise smooth surface. This hill causes the distance between the tip and the top of the molecule to decrease, thereby substantially increasing the tunneling current. The control system detects this increase and sends the appropriate voltages to the bimorph cantilever to cause the tip to move away from the surface sufficiently to bring the tunneling current back down to the constant level for which the system is calibrated. This movement of the tip or change in the voltages sent to the bimorph electrodes is detected and read as a logic 1. Other circuitry keeps track of the tip position and signals as each new cell is traversed. Thus, such a movement of a tip as it traverses a particular cell can be read as a 1 and lack of movement as it traverses another cell can be read as a 0. Such mass storage systems have the potential for tremendous information storage density because of the small, atomic scale dimensions involved.

Imaging applications of such a scanning tunneling microscope provide the ability to see the characteristics of surfaces on an atomic scale with greater resolution than has heretofore been attained. This allows the examination of such surfaces as semiconductor substrates during various stages of processing for research and development or quality control purposes. Vast numbers of other applications will be appreciated by those skilled in the art.

DETAILED DESCRIPTION OF THE PREFERRED EMBODIMENT

Figure 1:
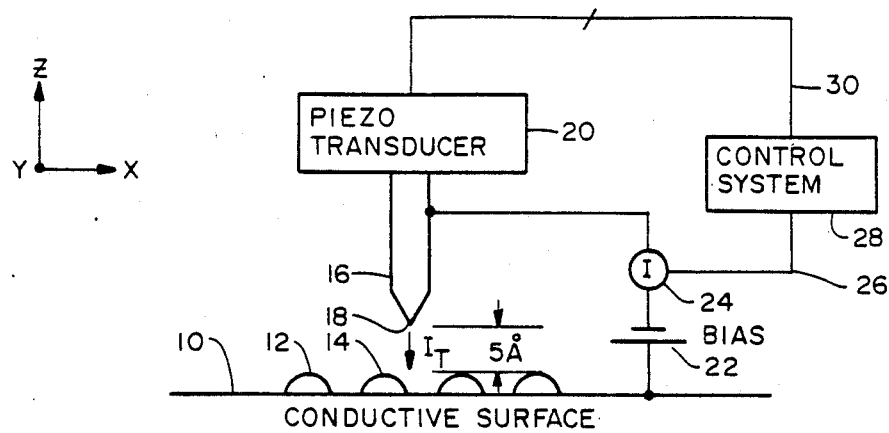
FIG. 1 is diagram of typical scanning tunneling microscope system.

Before discussing the details of the preferred and alternative embodiments of the integrated piezoelectric transducer, a scanning tunneling microscope (STM) using this transducer and methods for making these structures, it would be helpful to understand the teachings of the invention to explore the current state of the prior art in STM's. FIG. 1 depicts a prior art scanning tunneling microscope system which can be integrated according to the teachings of the invention. In FIG. 1, a conductive surface 10 having topographical features 12 and 14, etc., is scanned by a conductive tip 16. This tip is very narrow at its point, and preferably terminates in a single atom at the point 18.

The point 18 is scanned over the conductive surface 10 by a piezoelectric transducer 20. The purpose of this piezoelectric transducer is to scan the tip over the surface by defining a plurality of raster scan lines in the X-Y plane. The transducer 20 also moves the tip back and forth along the Z axis as the tip is scanned in the X-Y plane so as to maintain a distance between the tip 18 and the uppermost portion of the topographical feature over which the tip currently resides at a more or less constant distance. This distance is usually around 1 to 10 angstroms, and must be within the overlap region of the probability density functions of the electrons for the atoms in the tip 18 and the atoms in the uppermost regions of the topographical feature over which the tip currently resides. As long as the distance between the tip and the surface is within the overlap region of the probability density functions (tunneling range—usually less than 10 angstroms) and a bias voltage is applied across this junction, a tunneling current will flow between the tip 18 and the conductive surface. This tunneling current is symbolized by the arrow $I_T$.

The magnitude of the tunneling current $I_T$ is exponentially related to the distance between the tip and the surface. The magnitude of the tunneling current will decrease when the distance becomes larger and increase when the distance becomes smaller. To cause this tunneling current to flow, a bias voltage is applied between the tip 16 and the conductive surface 10 by a bias voltage source 22. A current sensor 24 senses the magnitude of the tunneling current $I_T$ and outputs a feedback signal on line 26 which is proportional to the magnitude of the tunneling current. A feedback circuit in control system 28 receives this feedback signal and generates suitable piezotransducer driving signals on the bus 30 to cause the piezoelectric transducer to move the tip 16 in such a manner as to maintain the tunneling current $I_T$ at a relatively constant value. The control system 28 also generates suitable piezoelectric transducer driving signals on the bus 30 to cause the tip 16 to be raster scanned across the conductive surface.

Figure 2:
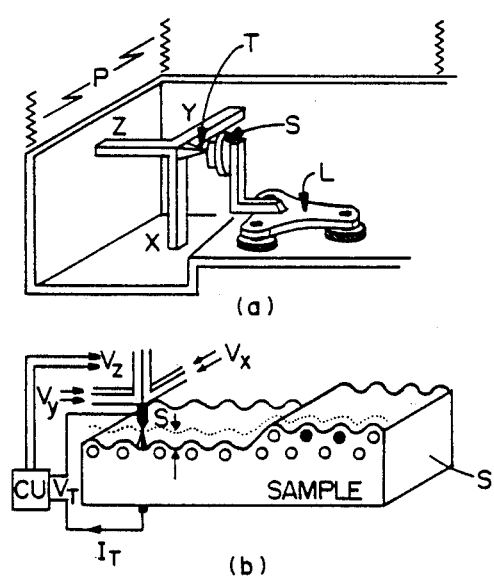
FIG. 2(a) and 2(b) are a view of a prior art discrete, large scale scanning tunneling microscope invented by IBM.

FIG. 2 is a diagram of a typical scanning tunneling microscope prior art structure as developed by IBM and as discussed in the above cited *IBM Journal of Research and Development*. FIG. 2 shows the mechanical details of the structure. The microscope tip T is scanned over the surface of a sample S with a piezoelectric tripod (X, Y, Z) in FIG. 2(a). A rough positioner L brings the sample within reach of the tripod. A vibration filter system P protects the instrument from external vibrations. In the constant tunneling current mode of operation, the voltage $V_Z$ is applied to the Z piezoelectric element by means of the control unit CU depicted in FIG. 2(b). The control unit keeps the tunneling current constant while the tip is scanned across the surface by altering the control voltages $V_X$ and $V_Y$. The trace of the tip generally resembles the surface topography. Inhomogeneities in the electronic structure of the sample's surface also produce structure in the tip trace. This is illustrated on the right half of the sample S as two surface atoms which have excess negative charge.

Process #1

Figure 3:
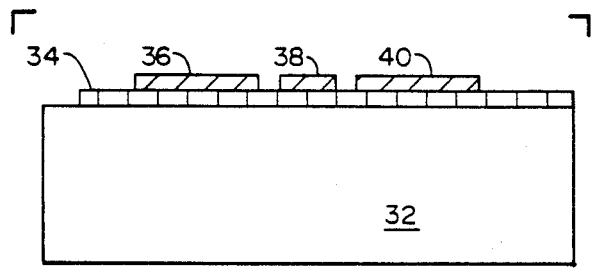
FIGS. 3-10 are successive cross sectional views along the transverse axis of the bimorph cantilever of the intermediate stages in a first process of fabrication of the preferred structure for an integrated single lever bimorph cantilever with tip for a scanning tunneling microscope according to the teachings of the invention.

Referring to FIG. 3 there is shown an integrated structure representing an intermediate stage after the first several steps in a process for making an integrated scanning tunneling microscope using an integrated piezoelectric transducer. Fabrication starts with a substrate 32. Preferably this substrate is silicon or some other substrate suitable for forming integrated electronic circuits. However, the substrate may be any other material which is chemically, mechanically and thermally compatible with the materials which will be formed on top of the substrate. It is preferable to make the substrate 32 of a semiconductor material so that the control circuitry which will be used to cause the tip movement via the piezoelectric bimorph can be formed on the same substrate as the bimorph itself.

The first step in the fabrication sequence is to deposit a spacer layer 34 under the portion of the bimorph that is to be cantilevered. The bimorph will be attached to the substrate at the end opposite the tip, so no spacer material is formed in this attachment region. This spacer layer will later be removed to provide a space between the uppermost surface (most positive Z coordinate) of the substrate 32 and the undersurface (most negative Z coordinate) of the piezoelectric bimorph which will be formed on top of the spacer layer 34. This will provide a clearance space for the piezoelectric bimorph to move along the Z axis. Preferably the spacer material is titanium, titanium/tungsten or polyimide. This spacer layer must be of a material such that it can be selectively etched without having the etchant attack the material of the substrate 32 or the material of the overlying electrode and piezoelectric material layers. This class of materials will be hereafter referred to as the class 1 group of materials. Any material which can be selectively etched without attacking the materials of the other layers will suffice for purposes of practicing the invention. Titanium/tungsten alloy (10% Ti: 90% W) is a class 1 material selectively etchable by hydrogen peroxide if the conductors are aluminum and the piezoelectric material is zinc oxide. Polyimide is another example of a class 1 material which can be selectively etched with an oxygen plasma. The thickness of the spacer layer 34 should be adequate to provide sufficient space for the bimorph to move in the negative Z direction.

Next, a layer of conductive material is deposited on top of the spacer layer. This layer of conductive material is photolithographically patterned and etched to form three electrodes 36, 38 and 40. The purpose of these electrodes will become clear later when the operation of the entire structure is detailed. Note, that although electrode 38 is shown to be more narrow than the electrodes 36 and 40 in the figures, in reality the electrodes 36, 38 and 40 are usually all the same size. This does not have to be the case however. The conductive layer from which the electrodes 36, 38 and 40 are formed is preferably of aluminum and is deposited to 0.1 to 1.0 $\mu$ thickness. The electrodes 36 and 40 are patterned to be approximately $3\tau \downarrow ^{100}$ $\mu$ wide each.

Figure 4:
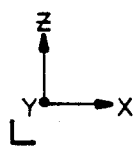
Figure 4:
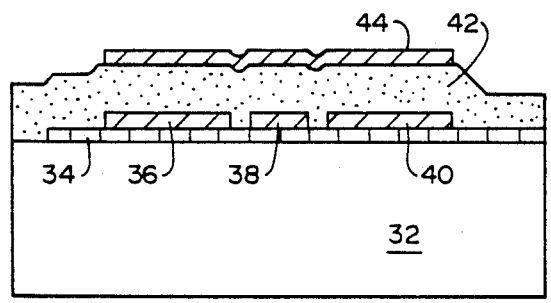

Referring to FIG. 4, there is shown another intermediate stage in the fabrication of the integrated piezoelectric scanning tunneling microscope after the first layer of piezoelectric material has been deposited. After formation of the first three electrodes, the next step in the process is to deposit the first layer of piezoelectric material over the entire surface of the chip. This layer 42 is zinc oxide in the preferred embodiment of the structure and is deposited to 2 $\mu$ thickness by reactive sputtering in an oxygen ambient. Methods for depositing zinc oxide are well known and are described in the following references which are hereby incorporated by reference: Rozgonyi and Polito, *Preparation of ZnO Thin Films By Sputtering of the Compound in Oxygen and Argon*, Applied Physics Letters, pp. 220–223, Vol. 8, Number 9 (1966); Denburg, *Wide-Bandwidth High-Coupling Sputtered ZnO Transducers on Sapphire*, IEEE Transactions On Sonics and Ultrasonics, pp. 31–35, Vol. SU-18, No. 1, (Jan. 1971); Larson et al., *RF Diode Sputtered ZnO Transducers*, IEEE Transactions on Sonics and Ultrasonics, pp. 18–22 (Jan. 1972); Shiosaki et al., *Low-Frequency Piezoelectric-Transducer Applications of ZnO Film*, Applied Physics Lett., pp. 10–11, Vol. 35, No. 1, (1 July 1974); Khuri-Yakub et al., *Studies of the Optimum Conditions For Growth of RF-Sputtered ZnO Films*, pp. 3266–3272, Journal of Applied Physics, Vol. 46, No. 8 (Aug. 1975); Chen et al., *Thin Film ZnO-MOS Transducer With Virtually DC Response*, pp. 945–948, 1985 Ultrasonics Symposium of IEEE; Royer et al., *ZnO on Si Integrated Acoustic Sensor*, pp. 357–362, Sensors and Actuators, 4 (1983); Kim et al., *IC-Processed Piezoelectric Microphone*, pp. 467–8, IEEE Electron Device Letters, Vol. EDL-8, No. 10 (October 1987). Next, a layer of conductive material 44 is deposited over the first piezoelectric layer 42. The purpose of this conductive layer is to form a center electrode between the two layers of piezoelectric material which will be used to form the bimorph. Preferably, the layer 44 is aluminum and is deposited to 0.1 to 1.0 $\mu$ thickness. From this layer a center electrode is photolithographically formed to be approximately 10 to 200 $\mu$ wide.

Figure 5:
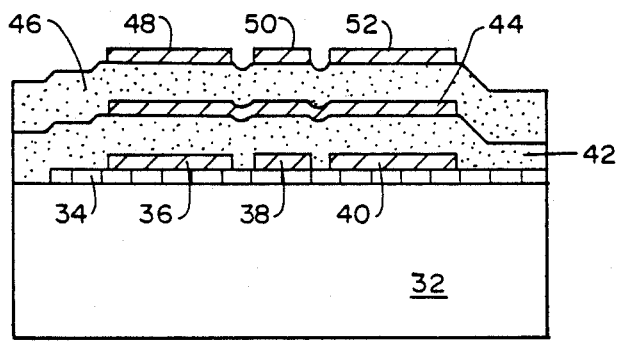

Referring to FIG. 5, there is shown another intermediate stage in the fabrication of the bimorph after the second piezoelectric layer has been deposited. This second piezoelectric layer 46 is zinc oxide in the preferred embodiment of the structure and is deposited to 2 $\mu$ thickness. Next a layer of conductive material is deposited on top of the second piezoelectric layer 46. Preferably, this layer of conductive material is approximately 0.1 to 1.0 $\mu$ thick aluminum. In some embodiments, an additional 1000 angstroms of gold is deposited on top of the aluminum. From this conductive layer, three electrodes 48, 50 and 52 are formed by photolithographic patterning. These electrodes are aligned with the locations of the electrodes 36, 38 and 40 and have the same widths as those electrodes. Preferably, the electrodes 48, 50 and 52 are deposited using lift-off techniques.

Figure 6:
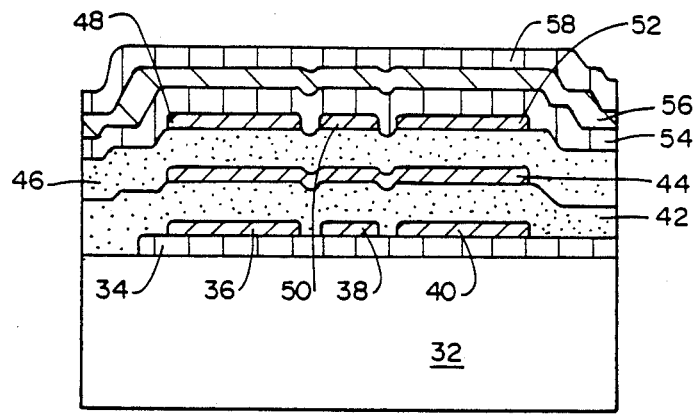

Referring to FIG. 6, there is shown an intermediate stage in the process of manufacture after the first few steps of the process of forming the tip on the center electrode 50 have been performed. Fabrication of metal cones by evaporation is not a new technique, but has been previously described by Spindt et al., *J. Appl. Phys.*, 47, 5248 (1976). FIG. 6 depicts an alternative embodiment of the tip formation process using an integrated shadow mask.

Basically the process of forming a tip having sufficient sharpness is best done through the use of a shadow mask. In FIG. 6, this shadow mask is formed from layers which are deposited over the uppermost group of three electrodes 48, 50 and 52. In the preferred embodiment of the structure, a separate wafer is processed to form a shadow mask with alignment keys, and this separate wafer is placed over the structure shown in FIG. 5 by aligning the alignment keys on each wafer. The separate wafer and the structure of FIG. 5 are then processed to have lock and key physical characteristics such that the aperture in the shadow mask can be properly aligned over the center electrode 50. In the alternative embodiment shown in FIG. 6, the first step in forming the integrated shadow mask is to deposit a layer 54 of the class 1 spacer material. Again, this layer 54 must be selectively etchable by an etchant which will not attack the material of the electrodes 48, 50 and 52, or the zinc oxide of the layers 46 and 42. The layer of the spacer material 54 need not be the same type of material as used in the spacer layer 34. However, the material of both of these layers must be within the class 1 group of materials. No patterning is performed on the layer 54, and it is allowed to cover the entire structure. Next, a layer 56 of a class 2 material, preferably copper, is deposited over the spacer layer 54. A class 2 material is any material which may be selectively etched by an etchant which will not attack the class 1 material used above and below it and which can be etched away after tip formation without etching the material of the tip. In the preferred embodiment of the structure, the spacer layer 54 is 1000 angstroms of titanium/tungsten alloy. The layer 56 of class 2 material is preferably 2 $\mu$ of copper. Next, a 5000 angstrom layer 58 of class 1 spacer material is deposited over the class 2 layer 56.

Figure 7:
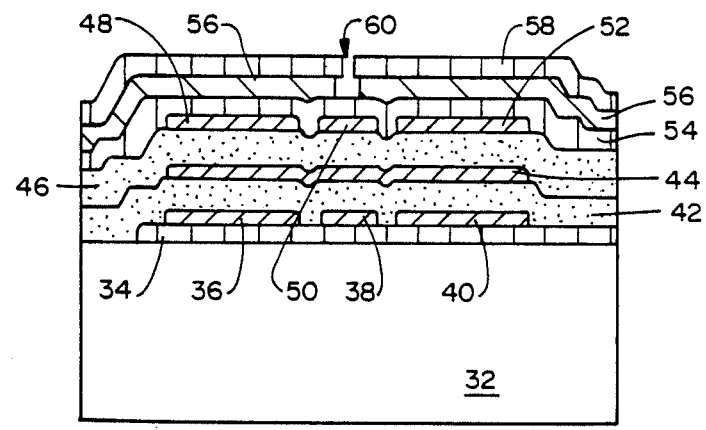

FIG. 7 shows the integrated structure at an intermediate stage during formation of the tip after etching of the spacer layer 58 and underetching of the class 2 layer 56. The formation of the tip is done by evaporation of a metal through a shadow mask aperture. This shadow mask aperture must be raised above the surface upon which the tip is to be formed so that a cone of material may be built up before the shadow mask aperture is closed off by the deposition of the material on top of the shadow mask. In FIG. 7, the shadow mask is the layer 58 and the shadow mask aperture is the opening 60 in this layer. The opening 60 is formed by using a selective etchant for the class 1 material of layer 58 and conventional photolithographic techniques. The aperture 60 is defined to be 1-2 $\mu$ and is centered over the center of the electrode 50. Generally, the size of the aperture 60 should be much smaller than the size of the middle electrode 50. If the class 1 material of layer 58 is titanium/tungsten alloy, a suitable etchant for this selective etching step would be hydrogen peroxide.

After the aperture 60 is etched, the copper layer 56 must be etched back so as to underetch the perimeter of the aperture 60. The purpose for this underetching step is to provide clearance space for the walls of the tip cone which is to be formed later. The underetching step of the class 2 material of layer 56 is performed using a selective etchant which only attacks the class 2 material. If layer 56 is copper, this etch is performed using the aperture 60 as a mask and using a mixture of nitric acid, hydrogen peroxide, and water in a ratio of 10:1:100, respectively. That is, the etchant is 10 parts $HNO_3$ to 1 part $H_2O_2$ to 100 parts $H_2O$.

Figure 8:
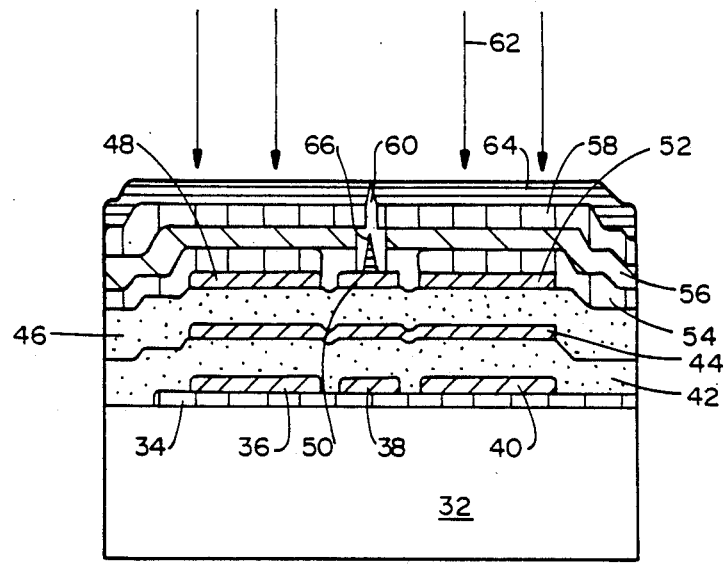

Referring to FIG. 8, there is shown the state of the structure in the intermediate stage of construction after formation of the tip but before removal of those layers which were formed in the process of forming the tip. Prior to the evaporation deposition of the tip material, a third etch step is performed to selectively etch through the class 1 material of layer 54 to form an aperture over the center electrode 50. In some embodiments, a cleaning step will then be performed to clean the surface of the electrode 50 to prepare it for tip deposition. This is done to better insure adhesion of the tip material to the electrode 50. The selective etching of the layer 54 is performed using a timed liquid etch or plasma etch to expose the top surface of the electrode 50 This etching step also etches a little of the layer 58 and all of layer 54 down to the electrode 50. For this reason, the layer 58 should be formed at least twice as thick and preferably 3 times as thick as the layer 54. A timed sputter etch is used to clean the surface of electrode 50 if needed. Where the boundary of the aperture in the layer 54 is relative to the boundary of the aperture in the layer 56 depends upon whether a liquid or plasma etch is used to etch the layer 54. The boundary of the aperture in the layer 54 will be colocated with the boundary of the aperture in the layer 56 for liquid etches and will be approximately located with the boundary of the aperture 60 in the layer 58 if a plasma etch is used.

Next, the tip 66 is formed. In the preferred embodiment of the structure, this tip is formed by evaporation in vacuum of tantalum or some other class 3 material. Any other material can be used for the tip 66 if it has the characteristics of a third class of materials hereafter defined. A class 3 material must be such that it does not oxidize appreciably in air and it must be such that it will not be etched by the etchant used to selectively etch the class 2 material of layer 56. Tantalum is such a material if copper is selected for the layer 56. Other possible materials for the tip would be aluminum coated with a noble metal by evaporation. Alternatively, the tip can be a noble metal standing alone, or any other conductor that can be selectively etched in the manner described above.

The evaporation of the class 3 material 62 from a point (approximately 1-5 mm) located far (approximately 10 cm) above the surface results in the formation of the layer 64. Note that as the evaporation continues through the aperture 60, the aperture in the layer 64 slowly decreases in diameter as evaporation continues due to condensation of the evaporated material on the sidewalls of the aperture. As the diameter of the aperture in the layer 64 continually decreases, so does the diameter of the cone of material in the tip 66 being formed beneath this aperture. When the aperture in the layer 64 finally closes itself off, formation of the tip 66 is complete, and a very sharp tip (tip radius less than 1000 angstroms) will have been fabricated.

Figure 9:
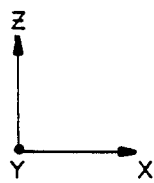
Figure 9:
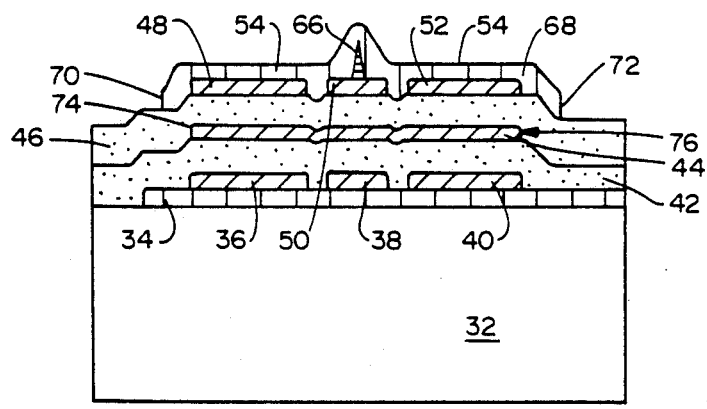

Referring to FIG. 9, there is shown a cross section of the structure at an intermediate stage in the construction after lift-off of the shadow mask layers and deposition of a zinc oxide etch mask layer. Following the processing steps described with reference to FIG. 8, it is necessary to remove the layers 54, 56, 58 and 64 so as to expose the tip 66. This is done using a lift-off etch to remove the class 2 material of layer 56. This lift-off etch removes all the layers above layer 54, i.e., the class 2 layer 56, the class 3 layer 64 and the class 1 layer 58.

Next, it is necessary to etch the piezoelectric layers 46 and 42 to define the sidewalls of the bimorph cantilever beam. This is done by photolithographically patterning the remaining layer 54 to serve as an etch mask for the zinc oxide as described previously. Layer 54 is patterned to have the configuration shown in FIG. 9. Note that the edges 70 and 72 of this layer are located along the X axis outside of the edges 74 and 76 of the metal electrode layer 44. The reason for this location is to insure that the edges 74 and 76 of the middle electrode are completely encased in the zinc oxide of the layers 46 and 42. The purpose for this is to prevent leakage currents and arcing between the electrodes 36, 40, 44, 48 and 52 which would lower the breakdown voltages and prevent the device from operating at high voltages. The purpose of formation of the etch mask 68 is to improve the resolution of the etching of the piezoelectric layers 42 and 46. Etching of piezoelectric material such as zinc oxide using photoresist provides very bad resolution as to the exact location of the edge of the piezoelectric material relative to the edge of the photoresist. It has been found that substantial improvements in the certainty of the location of this edge can be made by first forming an etch mask of the class 1 material such as titanium/tungsten alloy and then using this etch mask to guide the etching of the piezoelectric material. Thus, after the layer 68 is formed, a solution of 15 grams $NaNO_3$, 5 ml $HNO_3$ and 600 ml $H_2O$ is used to etch the piezoelectric layers 46 and 42 back to the approximate location of the edges 70 and 72.

After the tip is exposed, and the piezoelectric layers are etched, the spacer layer 34 is selectively etched away to free the cantilever.

Figure 10:
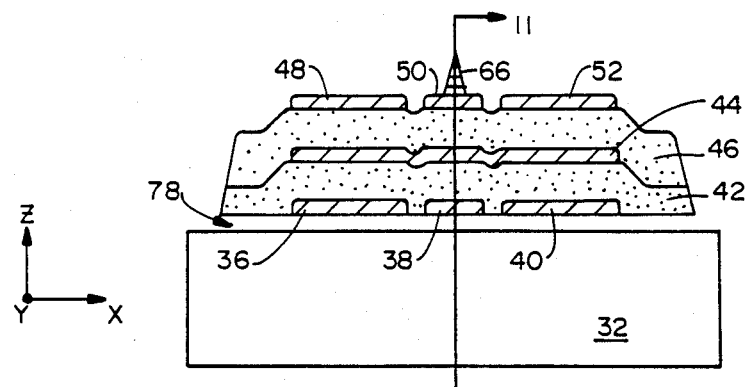

FIG. 10 shows in cross section the preferred final piezoelectric bimorph transducer structure in integrated form according to the teachings of the invention after selective etching of the spacer material layers 34 and the etch mask layer 54. Note the aperture 78 formed by the removal of the spacer layer 34. It is this void which allows the tip 66 to move along the Z axis under the influence of the forces generated by the piezoelectric material.

Figure 11:
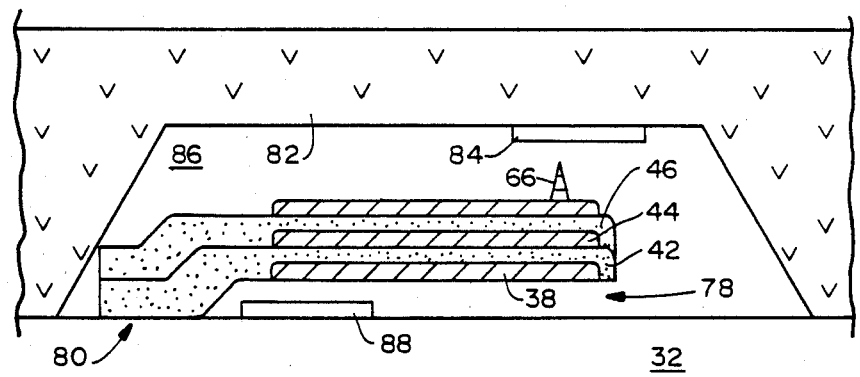
FIG. 11 is a cross sectional view of the final scanning tunneling microscope preferred structure taken along the longitudinal axis of the bimorph cantilever.
Figure 12:
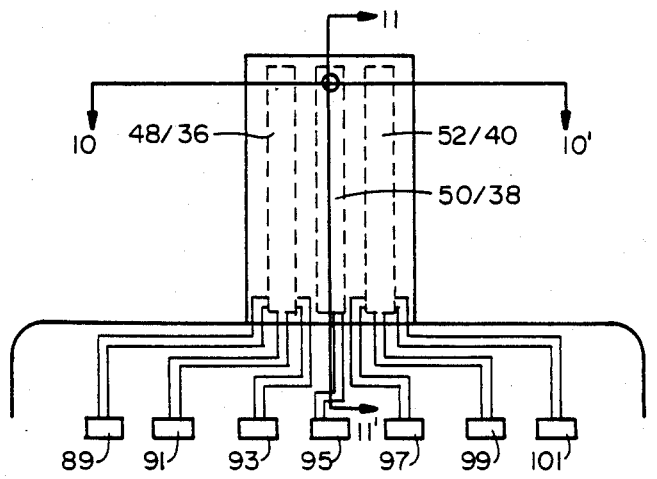
FIG. 12 is a plan view of the one cantilever preferred bimorph structure according to the teachings of the invention.

FIG. 11 shows a cross sectional view of the bimorph cantilever taken in the Y-Z plane, whereas the cross section of FIG. 10 is taken in the X-Z plane. A plan view of the bimorph cantilever is shown in FIG. 12 looking down the Z axis at the X-Y plane. FIG. 12 shows the locations of the sections taken in FIGS. 10 and 11 as the section lines 10-10' and 11-11', respectively. Note in FIG. 11 the cantilevered nature of the bimorph structure, the bimorph being attached to the substrate 32 only in the area 80. The relative dimensions in FIG. 12 may be not truly indicative of an actual design which would be commercially employed. Bonding pads 89, 91 and 93 are coupled by conductive paths to the two electrode pairs comprised of electrodes 48, 36 and 44. Bonding pads 97, 99 and 101 are coupled by conductive paths to the two electrode pairs comprised of electrodes 52, 40 and 44. Bonding pad 95 is coupled by conductive paths to both the electrodes 50 and 38 and the tip 66. In embodiments where the control circuitry is integrated on the substrate 32, the bonding pads shown in FIG. 12 can be eliminated.

Necessary Additional Elements Needed For An STM

Referring again to FIG. 11, there are several additional elements of a scanning tunneling microscope system which are necessary for converting the cantilever bimorph piezoelectric transducer shown in FIG. 11 to a system having multiple commercial applications. An overlying wafer 82 having a conductive surface 84 is formed with a cavity 86 such that the wafer 82 may be physically attached to the substrate 32 with the conductive surface 84 overlying and within several microns of the end of the tip 66, such that the tip can be brought up to the surface 84 by bending of the bimorph. In the preferred embodiment of the scanning tunneling microscope (STM) structure, the wafer 82 may be Pyrex or silicon, but, in alternative embodiments, the wafer 82 may be any other material which is mechanically, thermally, and chemically compatible with the materials used in the rest of the structure. Preferably, the material of the wafer 82 should be such that a good bond may be made between the wafer 82 and the substrate 32, and such that suitable convenient fabrication techniques are known which may be used to form the cavity 82 and to attach a conducting surface 84 to the wafer 82. In still other alternative embodiments, the wafer 82 may be itself a conductive material such that no separate conductive surface 84 needs to be attached. In such embodiments, the cavity 86 should be such that the portion of the wafer 82 of interest is scanned by the tip 66. Also, the electrodes 36, 38, 40, 44, 48, 50 and 52 will have conductive pathways formed through the piezoelectric layers and across the surface of the substrate 32 to bonding pads such that the appropriate voltages may be applied to these electrodes to cause the tip 66 to scan in the desired manner. If these conductive pathways pass between the surface of the substrate 32 and the mating surface of the wafer 82, the materials for these two structural elements must be selected such that the conductive pathways may be properly formed.

In some embodiments, the control circuitry to supply the bias current to the tip 66 and to control the voltages applied to the various electrodes will be integrated on the substrate 32. The block 88 represents the integration of such known circuitry on the substrate in known manner. The position of the block 88 is illustrative only since this circuitry may be integrated on the side of the substrate, in a recess in the substrate, or on the reverse side of the wafer opposite the side from which the bimorph cantilever is formed. It is preferred to integrate the circuitry at a location to minimize the complexity of routing the various signals and control voltages to the appropriate nodes of the circuit.

The structure shown in FIG. 11 can be used for mass storage, microscopic photolithography, imaging and other commercial applications.

Figures 13, 14:
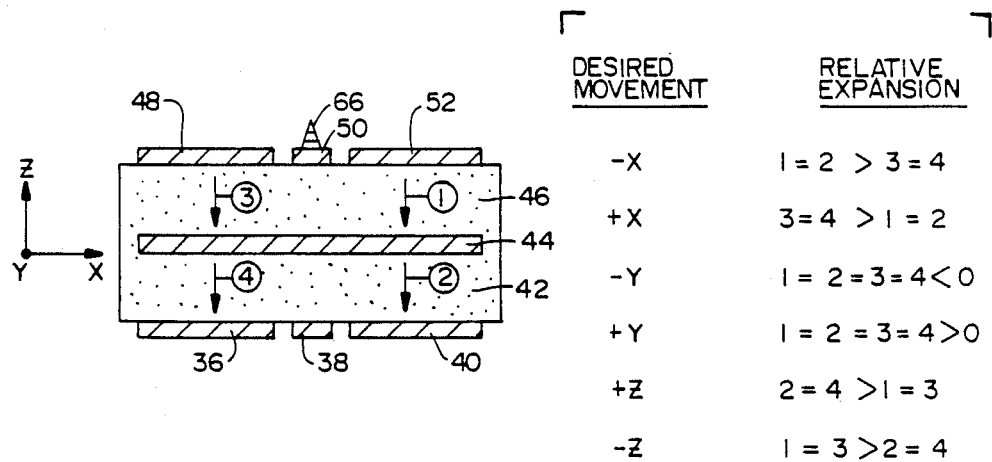
FIG. 13 is a diagram of the four pairs of electrodes in the one cantilever bimorph used to explain how three axis motion is achieved.
FIG. 14 is a table of the various voltages that must be applied to achieve motion in any particular axis.

Referring to FIG. 13, there is shown a schematic diagram of a cross section through the bimorph cantilever to illustrate how the various electrodes are operated to cause movement of the cantilever in the Cartesian coordinate system. The cross section of FIG. 13 has the same orientation as the cross section 10-10' in FIG. 12. The vectors marked 1, 2, 3 and 4 in FIG. 13 represent the electric field vectors existing between the four pairs of electrodes. The electric field vector 1 represents the field between the electrode 52 and the center electrode 44. The electric field vector 2 represents the field between the center electrode 44 and the outer electrode 40. The electric field vector 3 represents the field between the electrode 48 and the center electrode 44, and the electric field vector 4 represents the field between the center electrode 44 and the outer electrode 36. In each case, the electric field is directly proportional to the potential difference applied to the pair of electrodes bounding the region of interest.

The nature of the piezoelectric zinc oxide is such that if a field is applied in the Z direction (which is along the crystalographic C-axis of the material) that causes the material to contract along that axis, and the material simultaneously expands along both the X and Y axes. Only expansions or contractions along the Y axis cause any bending of the bimorph. Hence, the following discussion refers to Y-axis motion only.

Referring to FIG. 14, there is shown a table of the desired movements in the Cartesian coordinate system having the axes oriented as shown to the left of FIG. 13, said table correlating these desired movements to relative expansions in the piezoelectric material in accordance with the relationships given on the right half of the table. The manner in which the table of FIG. 14 is interpreted is as follows. If it is desired to cause movement of the bimorph of FIG. 13 in only the negative X direction, it is necessary to charge the electrodes 52 and 44, and 44 and 40, respectively, such that the relative Y-axis expansion of the piezoelectric material in the layers 46 and 42 between these two pairs of electrodes is equal. Further, it is necessary to charge the electrodes 48 and 44, and 44 and 36 such that the Y-axis expansion of the piezoelectric material in the layers 46 and 42 between these two pairs of electrodes is also equal, but such that the Y-axis expansion between the electrode pairs 48 and 44, and 44 and 46, respectively, is less than the expansion between the electrodes 52 and 44, and 44 and 40, respectively. In other words, if one thinks of the vectors marked 1-4 in FIG. 13 as the relative magnitude of the Y-axis expansion of the piezoelectric material in the layers 46 and 42 in the localized areas through which these vectors pass, then to obtain negative X movement of the bimorph, it is necessary that the expansions in areas 1 and 2 be equal and greater than the expansions in areas 3 and 4. This causes movement of the bimorph in the negative X direction in the same mechanical fashion as a bimetallic strip works where one layer of metal in the bimetallic strip expands less than the other layer of metal. This causes forces which tend to cause the strip to bend toward the strip which expands less. From FIG. 14, it is seen that for positive X expansion the situation is exactly opposite as the situation previously described. That is, the expansions in the areas 3 and 4 are equal and exceed the expansions in the areas 1 and 2. Likewise, for negative Y movement, i.e., movement into the page of the tip 66, it is necessary to charge the electrodes 48, 52, 44, 36 and 40 such that the piezoelectric material in regions 1-4 all contract an equal amount. This contraction is signified as expansion less than zero. For positive Y movement, it is necessary to charge the same electrode such that regions 1-4 all expand by the same amount which is signified by an expansion greater than zero. For positive Z movement, it is necessary to charge the electrodes such that regions 2 and 4 expand equally and greater than the expansion in regions 1 and 3. Likewise, for negative Z movement, it is necessary to charge the electrode such that regions 1 and 3 expand an equal amount and greater than the expansion in regions 2 and 4.

It is possible to obtain any desired movement in the Cartesian space defined by the 3 axes coordinate system to the left of FIG. 13 by superimposing these relationships from any one axis upon the relationships for another axis. That is, if both negative X and positive Y movement is simultaneously required, the relationships from these two lines of the table of FIG. 14 are superimposed such that all four regions are expanded equally by an amount A to obtain the desired Y component with an additional expansion of regions 1 and 2 by an amount B over the expansion of regions 3 and 4 to obtain the desired negative X component. Note that electrode 50 only serves as a signal connection to the tip 66. The bottom electrode 38 is charged with the same bias voltage applied to the top center electrode 50 and the tip to eliminate any spurious, parasitic movements caused by expansion or contraction in the piezoelectric layer 46 under the center electrode 50. Any such movement is cancelled by the movements in the layer 42 caused by the charge on the bottom center electrode 38.

Process #2

Figure 15:
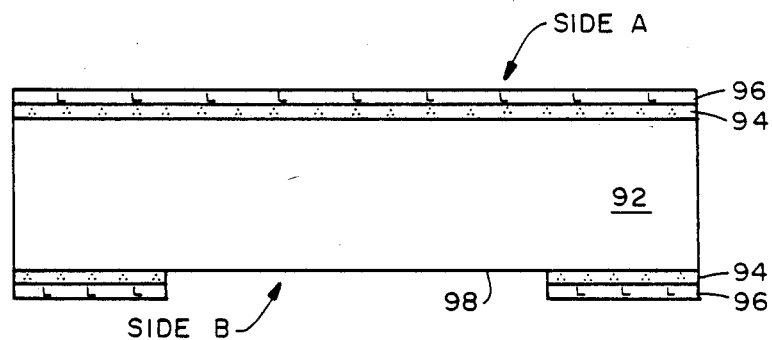
FIGS. 15-20 are cross sectional diagrams longitudinally through one bimorph of an alternative two bimorph piezoelectric transducer according to the teachings of the invention.

Beginning at FIG. 15, the fabrication of the two arm bimorph embodiment of a piezoelectric transducer according to the teachings of the invention is shown. Note that FIGS. 15 through 20 show a view of one bimorph lengthwise similar to the view shown in FIG. 11 of the transducer built according to the previously described process.

Referring to FIG. 15, there is shown an intermediate stage in the process of making an arm of a two arm bimorph using a backside etch technique. A substrate 92 is chosen which is preferably a semiconductor, but which may also be, in alternative embodiments, other materials capable of being micromachined. Semiconductor is desirable for the substrate so that control circuitry may be integrated on the same die as the bimorph itself. The first step in the process is to grow a 500 angstrom thick layer of silicon dioxide 94. Next, a 900 angstrom thick layer of nitride ($Si_3N_4$) is grown, and conventional photolithography techniques are used to define and etch a hole through the oxide layer 94 and nitride layer 96 to expose the surface of the substrate 92 as shown at 98.

Figure 16:
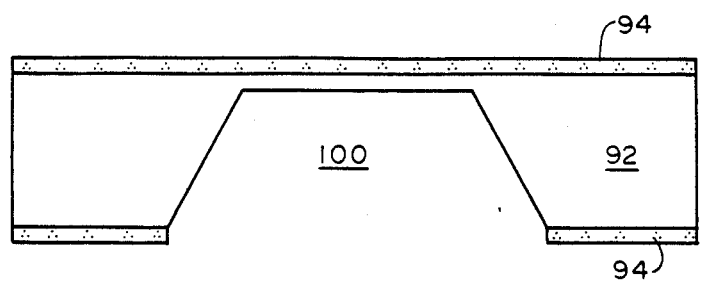

Referring to FIG. 16, there is shown another intermediate stage in the construction of a two arm bimorph after etching of the cavity. After defining the location of the aperture in the silicon dioxide and nitride layers as shown in FIG. 15, a KOH etch is used to etch a 350 $\mu$ deep trench in the substrate 92, using the nitride layer as an etch mask. This trench is shown at 100. Thereafter, the nitride layer 96 is stripped to leave only the silicon dioxide layer 94. Alignment marks are then patterned into side A to allow alignment to the pattern on side B (see FIG. 15).

Figure 17:
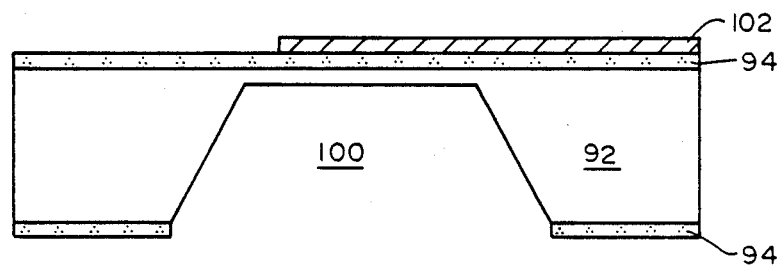

FIG. 17 shows another intermediate stage in the process after deposition of the first electrode layer. The next step is to deposit 0.1 to 1.0 $\mu$ of aluminum and to pattern it to form the electrode shown at 102.

Figure 18:
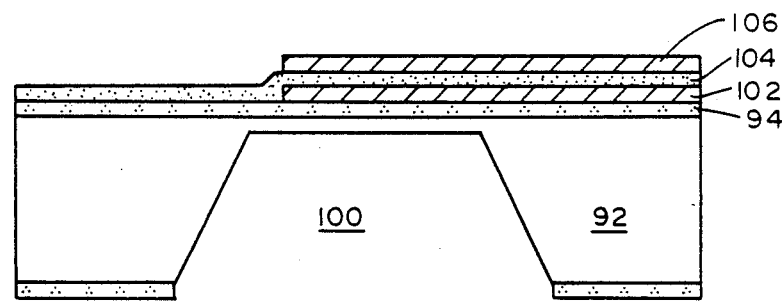

FIG. 18 shows another intermediate stage after deposition of the first piezoelectric layer and formation of a center electrode. After forming the electrode 102, a layer 104 of piezoelectric material is deposited. This layer is 2 $\mu$ of zinc oxide or some other piezoelectric material. Next, a 0.1 to 1.0 $\mu$ layer of aluminum is deposited and patterned and etched to form the center electrode 106.

Figure 19:
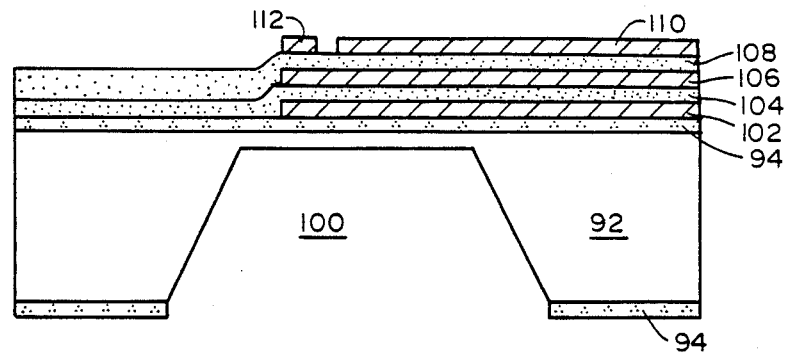

Referring to FIG. 19, there is shown an intermediate stage in the construction of the two arm bimorph after the second layer of piezoelectric material and the top electrode has been formed. After forming the middle electrode 106, 2 $\mu$ of piezoelectric material are deposited in a layer 108. This layer is zinc oxide or some other piezoelectric material. Next, 0.1 to 1.0 $\mu$ of aluminum and 1000 angstroms of gold are deposited over the piezoelectric layer 108. This layer of conductive material is then patterned and formed using lift-off techniques into the top electrode 110 and a tip electrode 112.

Figure 20:
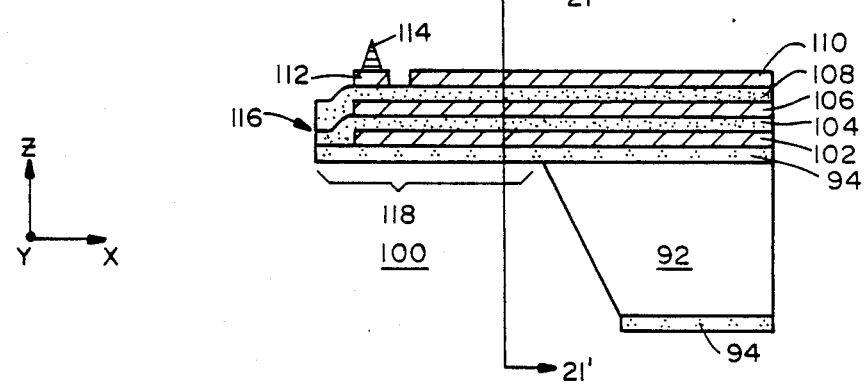

Referring to FIG. 20, there is shown another intermediate stage in the construction of the two arm bimorph after the tip has been formed and the structure has been underetched to free the bimorph. The process for forming the tip 114 is the same as described with reference to FIGS. 3-10. After the tip is formed, the zinc oxide is patterned and etched to form the edge 116. This process is done using the same class 1 etch mask material as was used in the process described with reference to FIGS. 3-10. Finally, a plasma etch is used to etch through the remaining substrate 92 to the silicon dioxide layer 94 to free the bimorph arm from attachment to the substrate 92 along the area 118.

Figure 21:
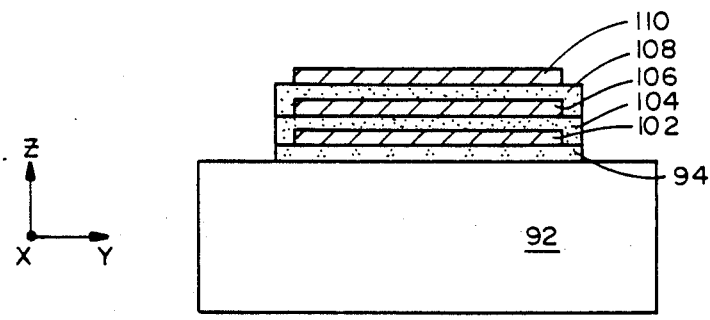
FIG. 21 is a transverse cross section of the bimorph construction in two bimorph embodiments.

FIG. 21 shows a cross section through the bimorph of FIG. 20 along the section line 21-21' in FIG. 20. As can be seen from FIG. 21 only two pairs of electrodes exist in the bimorph of FIG. 21. These two pairs of electrodes are the electrode 110 and the electrode 106, and the electrode 106 and electrode 102, respectively. Those skilled in the art will appreciate that this structure will allow the bimorph to bend up and down along the Z axis and expand or contract longitudinally along the X axis.

In order to get 3 axis Cartesian coordinate movement, a second arm having the structure shown in FIGS. 20 and 21 must be formed and joined to the bimorph of FIGS. 20 and 21 at the location of the tip 114. A plan view of the structure of this bimorph arrangement is shown in FIG. 22.

Figure 22:
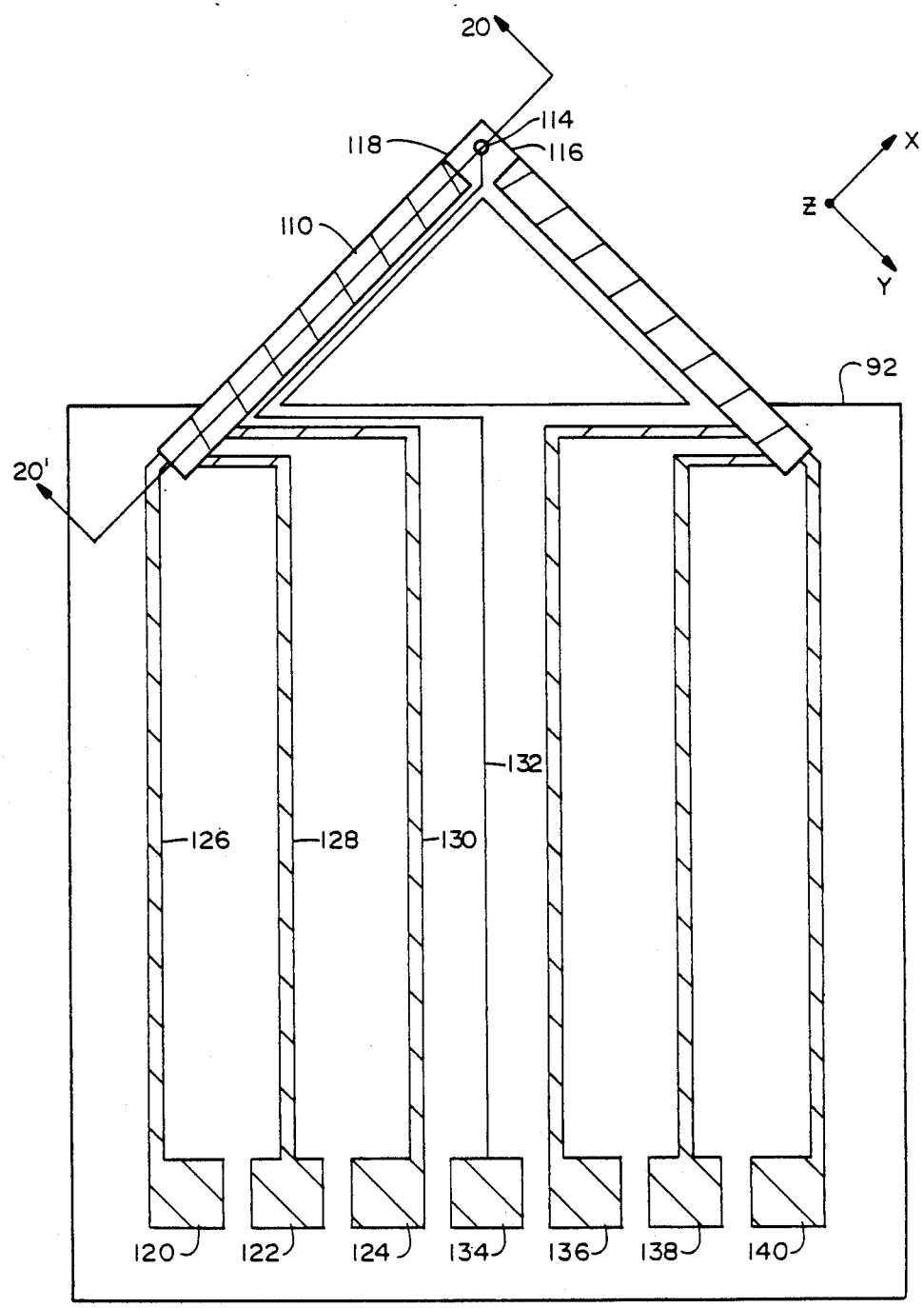
FIG. 22 is a plan view of a two bimorph embodiment of the invention with no control circuitry integrated on the substrate.

Referring to FIG. 22, the section line 20-20' indicates the position of the section through the structure of FIG. 22 as shown in FIG. 20. In the structure shown in FIG. 22, two bimorph arms, 116 and 118, extend from the substrate 92 at right angles joined at the approximate location of the tip 114. The bimorph 116 can move the tip 114 up and down along the Z axis and longitudinally along the X axis. The bimorph 116 can move the tip up and down along the Z axis and longitudinally along the Y axis. The bimorph 118 has its three electrodes 110, 106 and 102 coupled respectively to the bonding pads 120, 122 and 124. These connections are made via electrical conductors 126, 128 and 130, which are photolithographically formed simultaneously with the electrodes 110, 106 and 102 on the surface of the substrate 92. The tip 114 is coupled by an electrical conductor 132 to a bonding pad 134. The corresponding three electrodes of the bimorph 116 are coupled to bonding pads 136, 138 and 140. In alternative embodiments, the circuitry to drive bias voltages onto the six electrodes to cause movement of the tip and to bias the tip 114 with a correct voltage could be integrated on the substrate 92 thereby eliminating the need for the bonding pads shown at the bottom of FIG. 22. In such an embodiment, bonding pads would be present for supply of power to the circuitry used to bias the tip and drive the electrodes.

Process #3-Preferred

Figure 23:
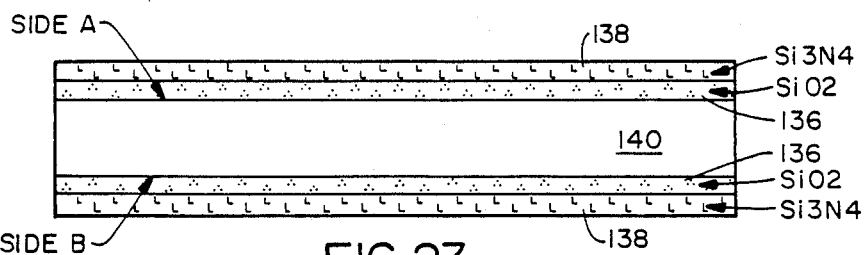
FIGS. 23-33 are cross sectional views of intermediate stages in the preferred process for construction of an integrated piezoelectric transducer and scanning tunneling microscope having either the preferred structure shown in FIG. 10 or the two arm structure shown in FIGS. 20 and 22.

The process described below is preferred to make either the one arm piezoelectric transducter having the structure of FIG. 10 or the two arm bipod piezoelectric transducer shown in plan view in FIG. 22 and in cross section in FIG. 20. Referring to FIG. 23, there is shown an intermediate stage in the preferred process for manufacturing a scanning tunneling microscope. The first step in the process is to clean a [100] silicon wafer of 380 micron thickness with a standard acid clean. The details of this cleaning process are given in Appendix A which is a detailed process schedule for the preferred process. Next, a layer 136 of silicon dioxide is thermally grown to a thickness of 5000 angstroms. Then, a layer 138 of silicon nitride is deposited to 1000 angstroms thickness over the silicon dioxide using low pressure chemical vapor deposition (LPCVD).

Figure 24:
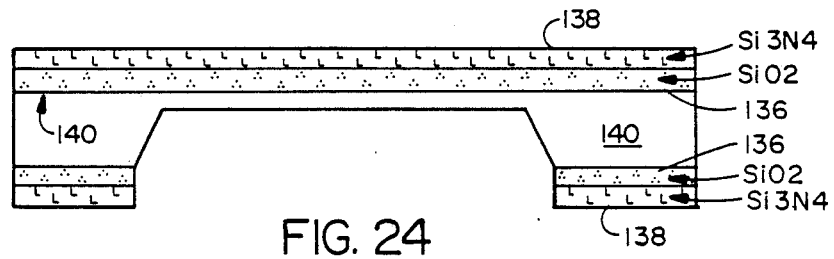

Referring to FIG. 24, there is shown the next stage in process after etching the backside pit. To free the bimorph cantilever to be formed later in the process, a backside etch is used. The first step in this process is to etch a pit in the backside. Negative photoresist (not shown) is applied and patterned to define the location of the pit. An oxygen plasma etch is then used to remove any remaining scum from the opening in the photoresist where the pit is to be formed. The details of this plasma etch are given in Appendix A. Next, the nitride layer 138 is etched using an $SF_6$ and F13Bl plasma etch at a ratio of 1:1. Then, the oxide layer 136 is etched using a 6:1 buffered oxide etch solution (BOE). Following these two etch steps, the remaining photoresist (not shown) is removed and the wafer is cleaned using the process detailed in the appendix. Then 340 microns of silicon from the substrate 140 are etched away using the nitride/oxide layers as an etch mask. This etch is performed using a 30% KOH etch at 80 degrees C. The wafer is then rinsed in a 10:1 $H_2O$:HCl solution, followed by a rinse in deionized water. This leaves the pit 142.

Figure 25:
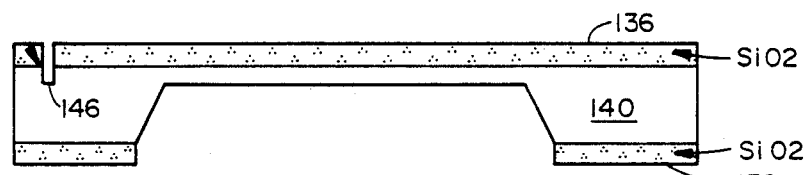

The substrate 140 has a polished front surface 144. Alignment marks are etched in this surface to facilitate the alignment of the various patterning steps to one another FIG. 25 shows the wafer after this alignment mark 146 has been etched. The procedure for forming these alignment marks starts by patterning photoresist to define the positions of the alignment marks 146. Then an oxygen plasma etch is used to descum the openings and the nitride layer 138 and the oxide layer 136 are etched using the same procedure defined above in describing FIG. 24. A deionized water rinse and nitrogen ambient dry cycle are performed followed by etching of 3 microns of silicon using a 1:1 $SF_6:C_2ClF_5$ plasma etch. The wafer is then cleaned in accordance with the procedure outlined in Appendix A, and the remaining photoresist is removed. The layer of nitride 138 is then stripped using concentrated $H_3PO_4$ at 165 degrees C. for 1 hour followed by a deionized water rinse and a nitrogen ambient drying cycle.

Figure 26:
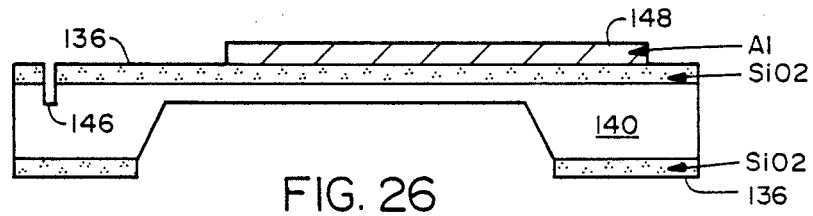

The next stage is shown in FIG. 26. To deposit the bottom electrode 148, the pattern of the electrode is defined with a positive resist liftoff process. Then the metal of the electrode is deposited by electron-beam evaporation deposition of 1000 angstroms of aluminum at room temperature. The excess aluminum is lifted of by soaking the wafer in hot acetone. The wafer is then rinsed in fresh acetone, methanol and deionized water and dryed in a nitrogen ambient.

Figure 27:
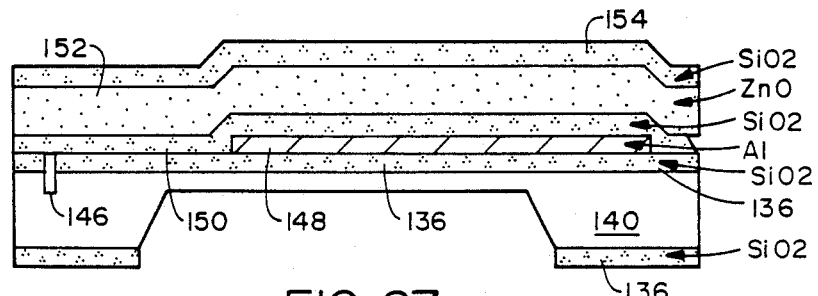

FIG. 27 defines the next stage in the process. After deposition of the lower electrode, it is necessary to deposit the piezoelectric layer. This is done by first sputter cleaning the surface for 30 seconds and electron beam evaporation deposition of 1000 angstroms of silicon dioxide 150 on the substrate while holding the substrate at a temperature of 200 degrees C. Next, a 2 micron layer 152 of zinc oxide is sputter deposited using a zinc target in 5:1 $O_2$:Ar gas ambient at 30 mTorr. During this process, the substrate is held to 300 degrees C. Then, a 1000 angstrom layer 154 of silicon dioxide is deposited over the zinc oxide by E-beam evaporation with the substrate at 200 degrees C.

Figure 28:
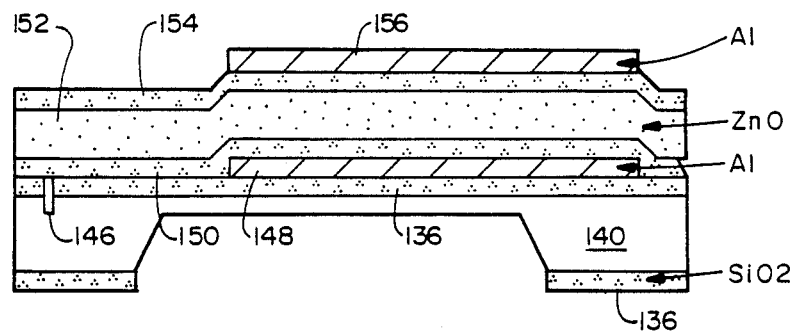

FIG. 28 shows the intermediate stage in the process after the middle electrode is formed. To deposit the middle electrode 156, the pattern for the electrode is defined using mask #4 and positive resist and a liftoff technique. Next, a 1000 angstrom layer of aluminum is deposited by electron beam evaporation using a room temperature wafer holder. The excess aluminum is then lifted off by soaking the wafer in hot acetone. The wafer is then rinsed in fresh acetone, methanol and deionized water followed by a drying cycle in nitrogen ambient.

Figure 29:
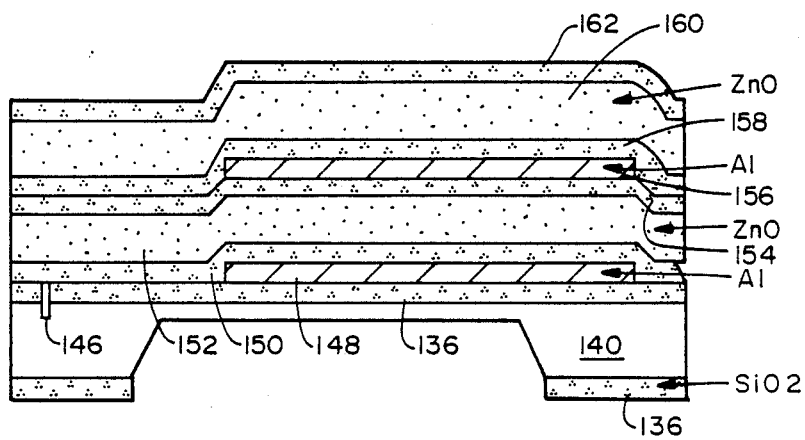

FIG. 29 shows the stage of the process after the upper oxide layers have been deposited. The first step in this process is to sputter clean the wafer for 30 seconds. Next, 1000 angstroms of silicon dioxide 158 are E-beam evaporation deposited with the substrate held at 200 degrees C. The top layer of piezoelectric material 160 is formed by depositing 2 microns of zinc oxide using a zinc target in a 5:1 mixture of oxygen and argon at 30 mTorr with the substrate at 300 degree C. Finally, a 1000 angstrom layer 162 of silicon dioxide is E-beam evaporation deposited over the zinc oxide with the substrate at 200 degrees C.

Figure 30:
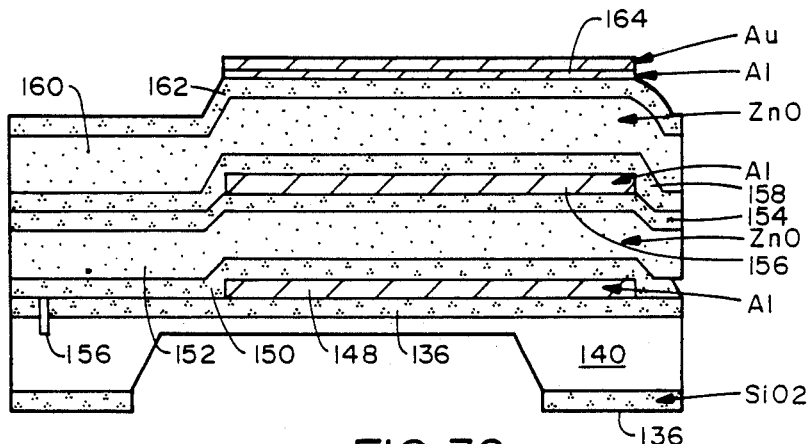

FIG. 30 shows the state of the wafer after the top electrode is formed. The top electrode 164 is formed by defining the pattern using a positive resist liftoff process. Then 500 angstroms of aluminum are deposited using a room temperature wafer holder and E-beam evaporation. This deposition is followed by an E-beam evaporation deposition of 500 angstroms of gold using a room temperature wafer holder. The excess gold and aluminum are then lifted off by soaking the wafer in hot acetone. The wafer is then rinsed in fresh acetone, methanol and deionized water and dryed in a nitrogen ambient.

Figure 31:
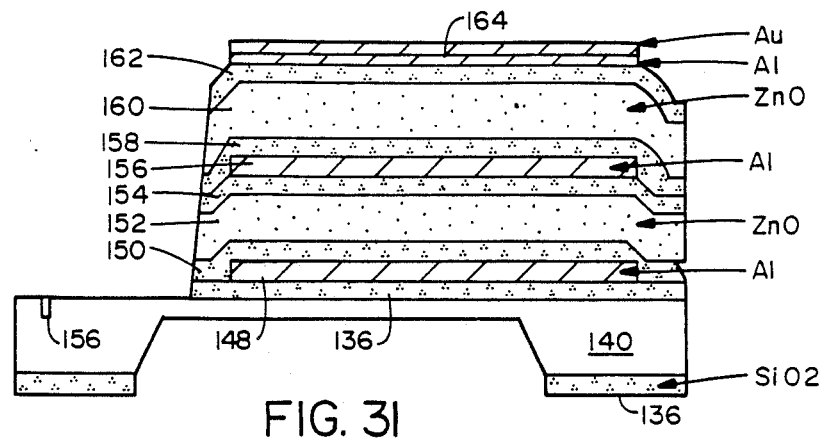

FIG. 31 shows the wafer after the oxides have been patterned. The first step in this process is to sputter deposit 3000 angstroms of titanium/tungsten using an unheated wafer holder. Then the pattern for the oxide is defined in the titanium/tungsten layer which is to be used as an etch mask. This is done by defining the desired pattern in photoresist deposited on the titanium/tungsten and etching the titanium/tungsten layer using 30% $H_2O_2$ for 30 minutes at room temperature. The wafer is then rinsed in deionized water and dryed in a nitrogen ambient. Patterning of the oxides then begins with etching of the top silicon dioxide layer 162 using 6:1 buffered oxide etch, followed by a deionized water rinse. The upper zinc oxide layer 160 is then etched in a solution comprised of: 15 grams of $NaNO_3$, 5 ml $HNO_3$, 600 ml $H_2O$ followed by a deionized water rinse. The middle layer 158 of silicon dioxide is then etched in the same manner as the layer 162, and the bottom layer 152 of zinc oxide is then etched using the same solution makeup as was used to etch the top layer 160. The bottom layer of silicon dioxide 150 is then etched using the same solution makeup used to etch the other layers of silicon dioxide. The wafer is then rinsed in deionized water and dryed. Next, 3 microns of silicon are removed from the top of the wafer in regions where all upper layers have been removed to expose the silicon substrate. This is done using a 1:1 $SF_6:C_2ClF_5$ plasma etch. The wafer is then cleaned and the resist is stripped using acetone, methanol and deionized water. The remaining titanium/tungsten etch mask is then removed in 30% $H_2O_2$ for 30 minutes at room temperature. The wafer is then rinsed in deionized water and dryed.

After the oxide layers are etched, the bonding pad metal is deposited by defining the pattern by a positive photoresist liftoff process. The metal is the deposited using E-beam evaporation of 1 micron of aluminum using a room temperature wafer holder. The excess aluminum is then lifted off by soaking the wafer in hot acetone. The wafer is then rinsed in fresh acetone, methanol and deionized water and dryed.

Next, the wafer side B is scribed using a diamond-tipped saw.

Figure 32:
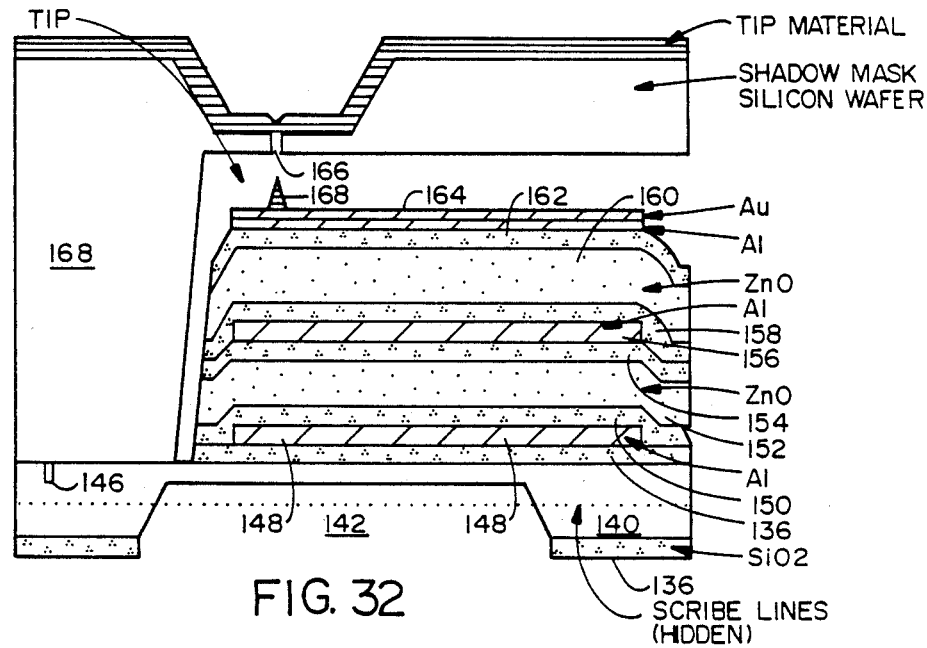

FIG. 32 shows the wafer after the shadow mask for tip formation has been put into place and the tip deposition has taken place. First, the wafer is sputter cleaned for 30 seconds. Then, a separate wafer is fabricated to have the cross section shown in FIG. 32. This wafer has an aperture 166 formed therein and has alignment marks that match the alignment marks 146. The wafer of the shadow mask 168 is then attached to the substrate 140 with alignment marks matched so as to locate the aperture 166 over the desired location on the top electrode 164 for the tip 168. After, the shadow mask is in place, 5-10 microns of the desired tip material, e.g., niobium or tantalum, are deposited through the aperture 166 to form the tip 168. Note, that in the preferred embodiment, the structure of FIG. 32 will be formed at multiple locations on the wafer, and only one shadow mask 168 will be used with multiple apertures at all the desired tip locations for all the cantilevers. Finally, the shadow mask is carefully removed so as to not damage the tips.

Figure 33:
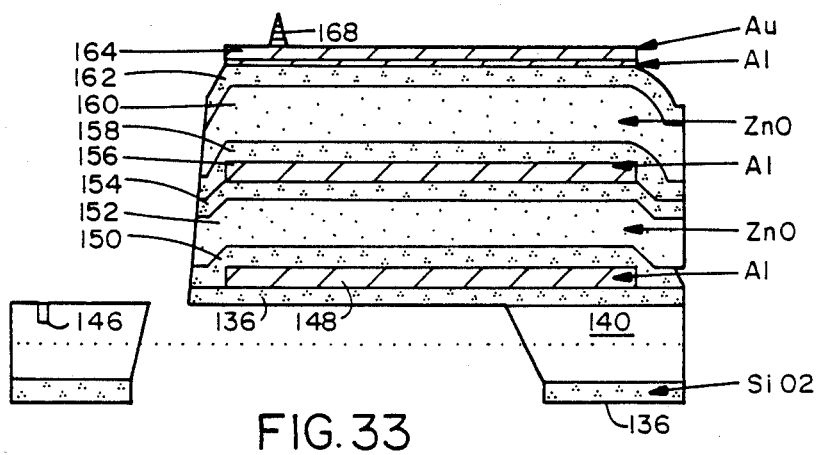

Next, the cantilevers are separated from the substrate along part of their length FIG. 33 shows the structure after this process has been performed. Separation is accomplished by depositing 10 microns of positive resist on side A of the wafer to protect the structure just described. The wafer is then subjected to a backside etch to etch through the remaining silicon membrane at the bottom of the pit 142 by subjecting side B of the wafer to a 3:1 $SF_6:C_2ClF_5$ plasma etch. The details of this etch are specified in Appendix A. The photoresist is then stripped using acetone, methanol and an air dry cycle. The individual die are then separated by cracking the wafer along the scribe lines.

The presence of the silicon dioxide layer 136 has been found to promote better growth of the aluminum layer 148 which also improves the growth of zinc oxide layers 152 and 160. It also allows conductive paths to be formed beneath the cantilever without being shorted out by the metal of the layer 148. The presence of the silicon dioxide layers 150 and 158 promotes better growth of the zinc oxide layers 152 and 160. The presence of the silicon dioxide layers 154 and 162 aids in balancing stresses in the cantilever which can build up during the deposition processes of forming the cantilever. That is, the same stresses will build up in the silicon dioxide layers 154 and 162 when they are deposited as build up in the silicon dioxide layers 150 and 158 when they are deposited. Accordingly, the stresses are balanced. Also, the silicon dioxide layers separating the pairs of electrodes increases the breakdown voltage. In alternative embodiments, the silicon dioxide layers may be omitted or other materials can be substituted.

The preferred method just described can be used to make either the "one-arm" or bipod type of piezoelectric transducer. The principal difference between these two different structures is in the number of electrode pairs that are formed inside each integrated cantilever. The one arm type of bimorph needs to have at least four pairs of electrodes formed to obtain 3 axis movement. If the one arm type of integrated transducer is to be used for a scanning tunneling microscope, 6 pairs of electrodes must be formed so that electrical connection can be made to the tip and the spurious piezo effects by this tip electrode can be cancelled out. For a two arm bipod type of transducer, only two pairs of electrodes need be formed in each bimorph arm. Obvious modifications to the above described process for the steps of forming the top electrode 148 and the bottom electrode 164 can be made depending upon the type of integrated piezoelectric transducer to be fabricated.

Figure 34:
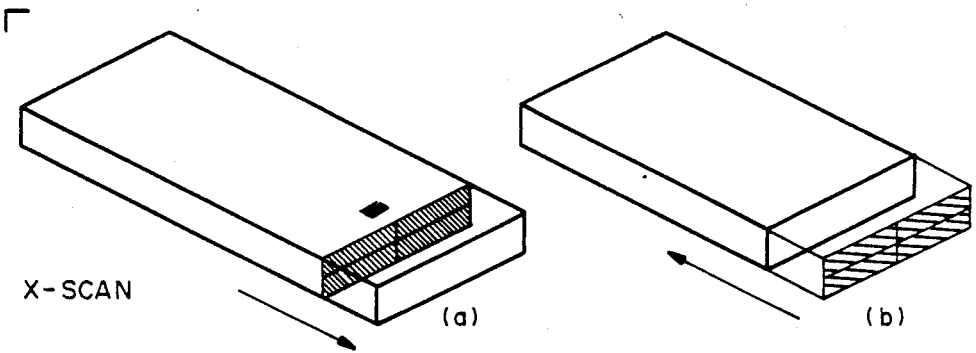
FIGS. 34(a) and (b) through 36(a) and (b) represent the types of X, Y and Z axis motion that can be achieved with single tip bimorphs having the structure shown in cross section in FIG. 10.
Figure 35:
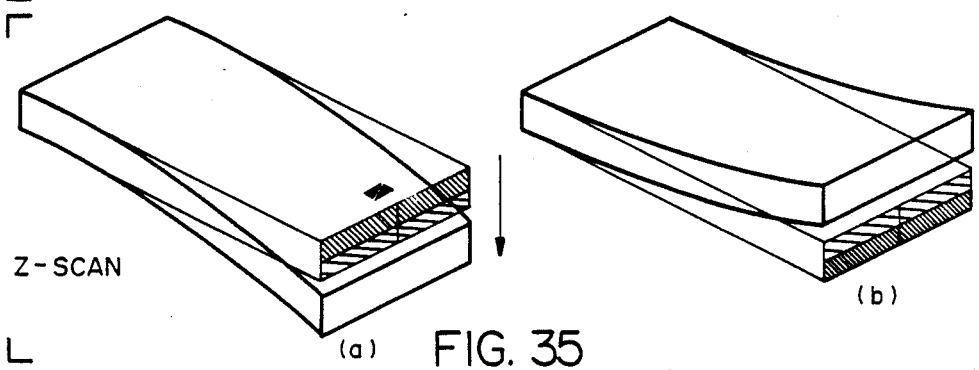
Figure 36:
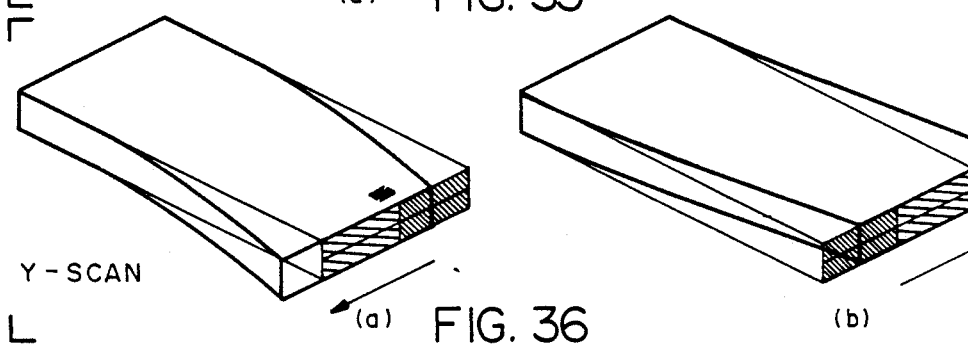
Figure 37:
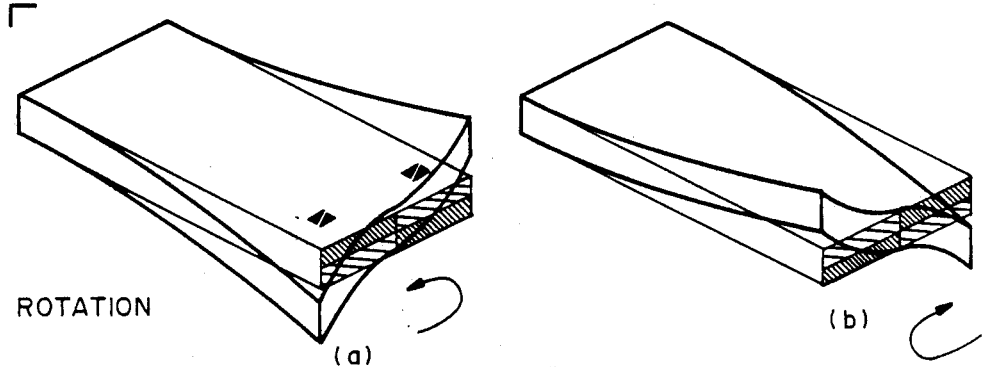
FIGS. 37(a) and (b) represent the types of rotational motion that can be achieved in two tip embodiments using a bimorph having the construction shown in FIG. 10 to provide independent Z axis motion and synchronous X and Y motion.

Referring to FIGS. 34(a) and (b) through 36(a) and (b) there are illustrated the movements which may be achieved with a one arm bimorph integrated piezoelectric transducer with the electrode structure shown in FIG. 10. The (a) and (b) illustrations of each figure depict both the positive and negative movements on the associated axis. FIG. 37(a) and (b) illustrate the type of rotational movement which may be achieved for two tip embodiments to have independent Z-axis movement for each tip. The tips move together along the Y and X axes however.

Typical performance parameters are as follows. If a dipod structure is considered with aluminum electrodes one micron thick and zinc oxide layers which are two microns thick, and the legs are each 1000 microns long and 100 microns wide, then the bipod will be able to move the tip 20 angstroms per volt in the X and Y axes and 0.6 microns per volt in the Z axis. The breakdown voltage is 30 volts and the scannable area is 600 angstroms by 600 angstroms or 360,000 square angstroms. If a single arm cantilever bimorph with the same dimensions as given in this paragraph is considered, 200 angstroms per volt of movement in the X axis and 20 angstroms per volt in the Y axis can be achieved. Movement of 0.6 angstroms per volt in the Z axis can be achieved. Thus, the scannable area for the single arm bimorph is 10 times larger than the dipod since the X axis movement is ten times greater per volt. The bimorph design must be such that the tip can be moved within tunneling range of the conductive surface for STM applications.

Although the invention has been described in terms of the preferred and alternative embodiments detailed herein, those skilled in the art will appreciate many modifications which may be made without departing from the spirit and scope of the invention. All such modifications are intended to be included within the scope of the claims appended hereto.

What is claimed is:

1. An integrated scanning tunneling microscope comprising:
   a substrate;
   a piezoelectric bimorph cantilever attached to said substrate at one end and with the other end having a protruding, conductive tip formed thereon, said tip terminating in a point, said bimorph further comprising two layers of piezoelectric material sandwiched between multiple pairs of electrodes in such a manner that three axis movement of said bimorph is caused by applying suitable potentials to said multiple pairs of electrodes;
   a conductive surface;
   means for holding said conductive surface such that the movement of said bimorph is sufficient to bring said tip within tunneling range of said conductive surface;
   bias means for applying a bias potential between said tip and said conductive surface sufficient to cause tunneling current to flow between said tip and said conductive surface;
   control means coupled to said bias means and coupled to said multiple pairs of electrodes for sensing the magnitude of the tunneling current flow and for adjusting the potentials applied between the appropriate pair or pairs of said electrodes so as to move said tip in a manner to stabilize said tunneling current.

2. An integrated scanning tunneling microscope comprising:
   a substrate;
   a piezoelectric bimorph cantilever attached to said substrate at one end and with the other end having a protruding, conductive tip formed thereon, said tip terminating in a point, said bimorph further comprising two layers of piezoelectric material sandwiched between multiple pairs of electrodes in such a manner that three axis movement of said bimorph is caused by applying suitable potentials to said multiple pairs of electrodes;
   a conducive surface;
   means for holding said conductive surface within the region of spatial overlap of the probability density function for the electrons of the atoms in said tip and the electrons of the atoms of said conductive surface;
   bias means for applying a bias potential between said tip and said conductive surface sufficient to cause tunneling current to flow between said tip and said conductive surface;
   control means coupled to said bias means and coupled to said multiple pairs of electrodes for sensing the magnitude of the tunneling current flow and for adjusting the potentials applied between the appropriate pair or pairs of said electrodes so as to move said tip in a manner to stabilize said tunneling current;
   wherein said means for holding said conductive surface close to said tip is a second substrate having a cavity formed therein and having said conductive surface in said cavity, said second substrate attached to said substrate so as to place said cavity over said bimorph such that said bimorph has room to move in all three axes and such that said conductive surface is held close to said tip such that the motion of the said bimorph is sufficient to bring said tip within tunneling range of the said conducting surface.

3. The apparatus of claim 2 wherein said control means is integrated circuitry formed on said substrate.

4. The apparatus of claim 1 wherein said bimorph comprises:
   a first conductive layer patterned into a plurality of electrodes including means for applying different electrical potentials;
   a first layer of piezoelectric material formed over said first conductive layer;
   a second conductive layer formed over said first layer of piezoelectric material, a second layer of
   piezoelectric material formed over said second conductive layer; and
   a third conductive layer formed over said second layer of piezoelectric layer patterned into a plurality of electrodes aligned with said plurality electrodes patterned in said first conductive layer.

5. The apparatus of claim 4 wherein said first and second layers of piezoelectric material are zinc oxide lead zirconate titanate.

6. The apparatus of claim 1 wherein said bimorph comprises:
   a first conductive layer formed into at least tow independent electrodes including means for charging each electrode independently of any other with an electric potential;
   a first piezoelectric layer formed over said first conductive layer;
   a second conductive layer;
   a second piezoelectric layer formed over said second conductive layer; and
   a third conductive layer formed over said second piezoelectric layer and formed into at least two independent electrodes including means for charging each electrode with an electric potential.

7. The apparatus of claim 6 wherein said bimorph cantilever is comprised of two bimorph cantilevers which are attached to said substrate at separate points and which extend out over the substrate at right angles to each other from the respective points of attachment and which are joined at the location of said point.

8. The apparatus of claim 1 where said means for holding holds said conductive surface within approximately 10 angstroms of said tip.

9. An integrated apparatus comprising:
a semiconductor substrate;
an integrated bimorph cantilever having first and second ends, said first end attached to said substrate and having a tip at each second end, said tip having a point, said bimorph comprising:
a first conductive layer patterned into a plurality of electrodes including means for charging each electrode with different electrical potentials;
a first layer of piezoelectric material formed over said first conductive layer;
a second conductive layer formed over said first layer of piezoelectric material to form a center electrode;
a second layer of piezoelectric material formed over said second conductive layer; and
a third conductive layer formed over said second layer of piezoelectric layer patterned into a plurality of electrodes aligned with said plurality electrodes patterned in said first conductive layer;
a conductive surface;
means coupled to said substrate for holding said conductive surface within a region such that the movement of said bimorph is sufficient to bring the tip within tunneling range of said conducting surface;
control means integrated on said substrate and coupled to said tip, said conductive surface and said electrodes of said bimorph cantilever for providing a bias voltage between said tip and said conductive surface, and for measuring the current flowing between said tip and said conductive surface, and for causing the appropriate voltages to be applied between the appropriate pairs of electrodes to cause said tip to move in an appropriate manner so as to maintain a desired tunneling bias current.

10. The apparatus of claim 9 wherein said piezoelectric material is zinc oxide or lead zirconate titanate and wherein said electrodes are aluminum.

11. The apparatus of claim 10 wherein said tip is tantalum.

12. The apparatus of claim 10 wherein said tip is niobium.

13. The apparatus of claim 10 wherein said tip is made of aluminum coated with a noble metal.

14. The apparatus of claim 10 wherein said tip is a noble metal.

15. The apparatus of claim 10 wherein said tip is an electrical conductor.

16. An integrated scanning tunneling microscope comprising:
a substrate;
a piezoelectric bimorph motion transducer attached to said substrate, and having an end cantilevered in free space and having a protruding, conductive tip formed thereon, said tip terminating in a point where said tip has the physical shape, orientation and size characteristic of an integrated tip structure formed by evaporation of conductive material through a shadow mask formed of mask material having an aperture aligned over said cantilevered end using integrated circuit manufacturing techniques, said motion transducer including a plurality of pairs of electrodes for receiving signals to cause said motion transducer to move;
a conductive surface;
means for holding said conductive surface such that the movement of said motion transducer is sufficient to bring said tip within tunneling range of said conductive surface;
bias means for applying a bias potential between said tip and said conductive surface sufficient to cause tunneling current to flow between said tip and said conductive surface;
control means coupled to said bias means and coupled to said plurality of pairs of electrodes, for sensing the magnitude of the tunneling current flow and for adjusting the potentials applied between an appropriate pair or pairs of said electrodes so as to move said tip in a manner to adjust said tunneling current to a desired level.

17. The apparatus of claim 16 further comprising a conductive surface to be scanned integrally attached to said substrate located so that the said motion transducer is able to bring said tip within tunneling distance from said conductive surface.

18. The apparatus of claim 16 wherein said motion transducer comprises:
a first piezoelectric bimorph having first and second ends and attached to said substrate at said first end and having said second end extending into free space away from said substrate;
a second piezoelectric bimorph having first and second ends, said first end attached to said substrate and said second end extending into free space away from said substrate and attached to said second end of said first bimorph.

19. The apparatus of claim 18 wherein said first and second bimorphs each comprise a first film of piezoelectric material having first and second parallel surfaces sandwiched between film conductors which contact said parallel surfaces of said first film of piezoelectric material and a second film of piezoelectric material having first and second parallel surfaces sandwiched between film conductors which contact said parallel surfaces of said second film of piezoelectric material.

20. The apparatus of claim 19 further comprising a plurality of layers of silicon dioxide or silicon nitride insulating each said film conductor from all said piezoelectric material.

21. The apparatus of claim 16 wherein said motion transducer comprises:
a piezoelectric bimorph transducer having a first end attached to said substrate and having a second end cantilevered in free space, comprised of at least two layers of piezoelectric film and a plurality of electrodes, with said plurality of electrodes arranged so as to sandwich said two layers of piezoelectric film and arranged relative to said two layers of piezoelectric film such that three dimensional movement of said second end is caused by the application of suitable voltage differences between groups of said electrodes.

22. The apparatus of claim 21 wherein said bimorph transducer is comprised of a first film of piezoelectric material having first and second parallel surfaces and having two or more film conductive electrodes formed so as to contact said first surface and having another film conductive electrode formed so as to contact said second surface, and further comprising a second thin film of piezoelectric material having first and second parallel surfaces, said first surface of said second piezoelectric film formed so as to contact said electrode which contacts said second surface of said first piezoelectric layer, and having at least one electrode formed so as to contact said second surface.

23. The apparatus of claim 22 further comprising a plurality of layers of silicon dioxide or silicon nitride insulating all said electrodes from adjacent layers of piezoelectric material.

* * * * *